(12) United States Patent
Imai

(10) Patent No.: US 8,560,288 B2
(45) Date of Patent: Oct. 15, 2013

(54) APPARATUS AND METHOD FOR CREATING ANALYSIS MODEL FOR AN ELASTOMERIC MATERIAL MEMBER WITH A STRONG NONLINEARITY

(75) Inventor: Kanako Imai, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 718 days.

(21) Appl. No.: 11/984,684

(22) Filed: Nov. 20, 2007

(65) Prior Publication Data
US 2008/0172213 A1    Jul. 17, 2008

(30) Foreign Application Priority Data

Jan. 16, 2007   (JP) ................. 2007-006872

(51) Int. Cl.
*G06G 7/48*   (2006.01)
(52) U.S. Cl.
USPC ............................................. 703/7
(58) Field of Classification Search
USPC .............. 703/7, 2; 277/380, 407, 596
See application file for complete search history.

(56) References Cited

U.S. PATENT DOCUMENTS

| | | | | |
|---|---|---|---|---|
| 4,353,568 A * | 10/1982 | Boyce | ............... | 280/89.11 |
| 5,588,721 A * | 12/1996 | Asano et al. | ............... | 303/163 |
| 6,829,563 B2 | 12/2004 | Miyamoto et al. | | |
| 6,925,416 B2 | 8/2005 | Miyamoto et al. | | |
| 6,962,420 B2 * | 11/2005 | Branham | ............... | 359/841 |
| 2001/0003387 A1 * | 6/2001 | Brakmann et al. | ......... | 267/64.27 |
| 2003/0055601 A1 | 3/2003 | Miyamoto et al. | | |
| 2004/0254745 A1 | 12/2004 | Miyamoto et al. | | |
| 2005/0086034 A1 | 4/2005 | Naito et al. | | |
| 2006/0106586 A1 * | 5/2006 | Naito | ............... | 703/2 |

FOREIGN PATENT DOCUMENTS

| | | |
|---|---|---|
| JP | 3-248025 | 11/1991 |
| JP | 09-280943 A | 10/1997 |
| JP | 10-062314 | 3/1998 |
| JP | 2002-365205 | 12/2002 |
| JP | 2005-121535 | 5/2005 |
| JP | 2005-121536 | 5/2005 |
| JP | 2006-138810 | 6/2006 |

OTHER PUBLICATIONS

Lu, Effects of viscoelastic properties of engine cover sealing system on noise and vibration attenuation, 2006, International Journal of Mechanics and Materials in Design, vol. 3 No. 3, pp. 277-284.*
Wang et al. Finite element simulation of the static characteristics of a vehicle rubber mount, Institution of Mechanical Engineers, vol. 216 Part D, pp. 965-973.*
MSC Software, Nonlinear Finite Element Analysis of Elastomers, 2001, MSC.Software Corporation, pp. 1-62.*
"Japanese Office Action" mailed by JPO and corresponding to Japanese application No. 2007-006872 on Jun. 28, 2011, with English translation.

* cited by examiner

*Primary Examiner* — Omar Fernandez Rivas
*Assistant Examiner* — Bernard E Cothran
(74) *Attorney, Agent, or Firm* — Fujitsu Patent Center

(57) ABSTRACT

A simple analysis model for an elastomeric material member with a strong nonlinearity is created, that is, for a rubber member gripped between a first member and a second member, first shell elements are created for the contact surface of the rubber member contacting the first member, second shell elements are created for the contact surface of the rubber member contacting the second member, and spring elements are created between specific nodes of the first and second shell elements. The spring constant of the created spring elements is identified by data of material tests.

14 Claims, 11 Drawing Sheets

APPARATUS AND METHOD FOR CREATING ANALYSIS MODEL FOR AN ELASTOMERIC MATERIAL MEMBER WITH A STRONG NONLINEARITY

BACKGROUND OF THE INVENTION

1. Field of the Invention

The present invention relates to the creation of an analysis model of an elastomeric material member with a strong nonlinearity, more particularly relates to the creation of an analysis model of an elastomeric material member with a strong nonlinearity gripped between a first member and second member.

2. Description of the Related Art

Mobile devices and other electronic devices are made waterproof or dustproof by forming the housing containing the electronic circuits etc. by a top member and a bottom member sealed airtight by rubber or another seal member. In this case, the rubber member is gripped between the top member and bottom member and held deformed. The thus deformed and held rubber member has to be suitably selected in accordance with the location where it is placed. Therefore, in the past, attempts have been made to analyze the rubber member etc. by numerical simulation using the finite element method.

In the conventional finite element method, the rubber member was divided into tetrahedral, pentahedral, or hexahedral solid elements to create a model, an approximation formula expressing the physical properties of the rubber was found from test data of the rubber member, and the approximation formula was used to define the material of the rubber member. However, a rubber member is a superelastomer with a nonlinear relationship between the stress and strain. Further, it sometimes is crushed or stretched to its limit by just a slight load. Further, there was the problem of a poor convergence of analysis by the approximation formula found. As a result, work such as changing the parameters became necessary and therefore time was taken until reaching a solution. Further, the range able to be approximated by an approximation formula was narrow. While matching with physical properties of an actual rubber member at one part, there was no longer a match if a little away from that part and therefore there was the problem that the precision of approximation became poor.

Note that evaluating a rubber or other material by simulation is known (see Japanese Patent Publication (A) No. 2005-121535, Japanese Patent Publication (A) No. 2005-121536, Japanese Patent Publication (A) No. 2006-138810, and Japanese Patent Publication (A) No. 2002-365205), but in each case, a solid model matching with the model shape was created when creating a model.

SUMMARY OF THE INVENTION

The present invention, in view of the above problems, has as its object the provision of an apparatus for creating an analysis model, a program for creating an analysis model, a method of creation of an analysis model, and method of design of an electronic device using an analysis model which can create a simple analysis model of an elastomeric material member with a strong nonlinearity and thereby shorten the time for creation of an analysis model.

To achieve the above object, according to a first aspect of the present invention, there is provided an apparatus for creating an analysis model of an elastomeric material member with a strong nonlinearity gripped between a first member and a second member, provided with a shell element creation unit creating first shell elements at node intervals found based on at least a total length of the elastomeric material member at a first contact surface of the elastomeric material member contacting the first member and creating second shell elements the same as the first shell elements at a second contact surface of the elastomeric material member contacting the second member, a spring element creation unit creating spring elements between nodes of the first and second shell elements, and a spring constant identification unit for identifying a spring constant of the spring elements.

Further, the shell element creation unit can find the node intervals to create first and second shell elements so that the intervals become equal intervals common for the total length of the elastomeric material member and a length of a test piece of the elastomeric material member for part of the elastomeric material member, the spring element creation unit can create spring elements between nodes of the created first and second shell elements to create a test model, and the spring constant identification unit can identify the spring constant of the test model using material test data of the elastomeric material member.

Further, the shell element creation unit creates the first and second shell elements at the same node intervals as the node intervals of the test model for the elastomeric material member as a whole, and the spring element creation unit creates spring elements between the nodes of the created first and second shell elements and uses the spring constant of the identified test model as the spring constant.

According to a second aspect of the present invention, there is provided a storage medium having stored thereon a computer program to create an analysis model of an elastomeric material member with a strong nonlinearity gripped between a first member and a second member, which program makes a computer perform a shell element creation function creating first shell elements at node intervals found based on at least a total length of the elastomeric material member at a first contact surface of the elastomeric material member contacting the first member and creating second shell elements the same as the first shell elements at a second contact surface of the elastomeric material member contacting the second member, a spring element creation function creating spring elements between nodes of the first and second shell elements, and a spring constant identification function for identifying a spring constant of the spring elements.

Further, the shell element creation function can find the node intervals to create first and second shell elements so that the intervals become equal intervals common for the total length of the elastomeric material member and a length of a test piece of the elastomeric material member for part of the elastomeric material member, the spring element creation function can create spring elements between nodes of the created first and second shell elements to create a test model, and the spring constant identification function can identify a spring constant of the test model using material test data of the elastomeric material member.

According to a third aspect of the present invention, there is provided a method for creating an analysis model of an elastomeric material member with a strong nonlinearity gripped between a first member and a second member, which method comprises finding node intervals so that intervals become equal intervals common for a total length of the elastomeric material member and a length of a test piece of the elastomeric material member for part of the elastomeric material member, creating first shell elements at the node internals at a first contract surface of the elastomeric material member contacting the first member, creating second shell elements the same as the first shell elements on a second contact surface of the elastomeric material member contacting the second member, and creating spring elements between nodes of the first and second shell elements so as to create a test model and using the test model to identify the spring constant of the spring elements.

Further, it is possible to create first shell elements at the node intervals of the test model at the first contact surface of the elastomeric material member contacting the first member for the elastomeric material member as a whole, create second shell elements the same as the first shell elements on the second contact surface of the elastomeric material member contacting the second member, and create spring elements between nodes of the first and second shell elements so as to create an analysis model and use the spring constant of the test model as the spring constant of the analysis model.

According to a fourth aspect of the present invention, there is provided a method for designing electronic equipment having an elastomeric material member with a strong nonlinearity gripped between a first member and a second member, comprising creating an analysis model, having an identified spring constant, comprising first shell elements created on a first contact surface of the elastomeric material member contacting the first member, second shell elements the same as the first shell elements created on a second contact surface of the elastomeric material member contacting the second member, and spring elements created between nodes of the first and second shell elements, using the analysis model to judge if the design conditions have been satisfied, and when the design conditions have not been satisfied, changing the design of at least one of the first member, the second member, or the elastomeric material member with a strong nonlinearity.

According to the present invention, it is possible to easily create a model of an elastomeric material member with a strong nonlinearity and possible to greatly reduce the model creation time. Further, like in the fourth aspect of the present invention, if using this for design of electronic equipment, the load on the designer can be reduced.

BRIEF DESCRIPTION OF THE DRAWINGS

These and other objects and features of the present invention will become clearer from the following description of the preferred embodiments given with reference to the attached drawings, wherein.

DESCRIPTION OF THE PREFERRED EMBODIMENTS

Before explaining the embodiments of the present invention, to facilitate understanding, an outline of the present invention will be explained using the example shown in FIGS. 1 to 5.

Figure 1:
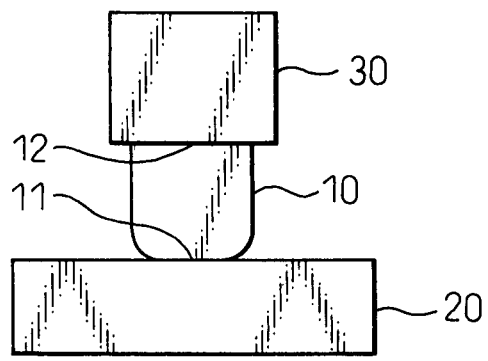
FIG. 1 is an explanatory view showing a cross-section of a rubber member gripped between a first member and a second member.

FIG. 1 shows a cross-section of an example of the object of the modeling according to the present invention. One example of the object of the modeling of the present invention, that is, the analyzed object model, is a rubber member 10 comprised of a superelastomer member, as an example of an elastomeric material member with a strong nonlinearity, pressed and gripped between a first member 20 and a second member 30. The rubber member 10 contacts the first member 20 at its first contact surface 11 and contacts the second member 30 at its second contact surface 12.

Figure 2:
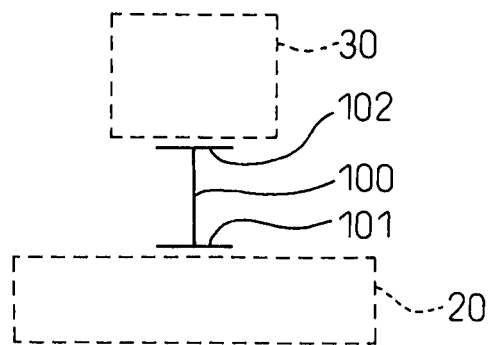
FIG. 2 is an explanatory view showing modeling of a rubber member according to the present embodiment.

FIG. 2 shows the results of modeling by shell elements and a spring element of the rubber member of FIG. 1. According to the present invention, as shown in FIG. 2, the rubber member 10 is modeled by a two-dimensional first shell element 101 created at the first contact surface 11, a two-dimensional second shell element 102 created at the second contact surface 12, and a one-dimensional spring element connecting the first shell element 101 and the second shell element 102.

Figure 3:
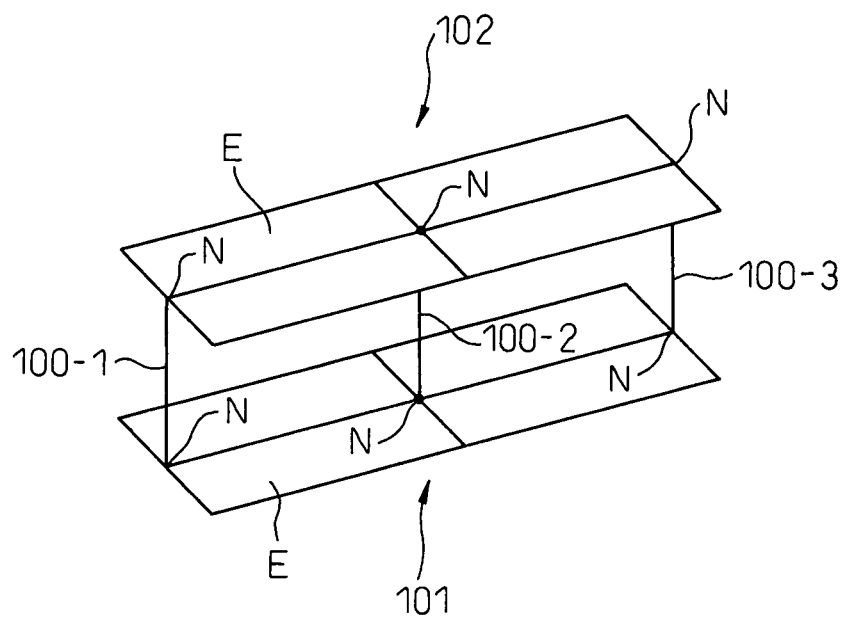
FIG. 3 is an explanatory view showing the relationship between spring elements and shell elements in the present embodiment.

FIG. 3 is a view explaining the relationship between spring elements 100 and the shell elements 101, 102 in the present invention. The first and second shell elements 101, 102, as shown in FIG. 3, are comprised of rectangular shaped meshes. The spring elements 100 (100-1, 100-2, 100-3) are configured by connecting nodes arranged at the centers of the first and second shell elements 101, 102 in the longitudinal direction.

Figure 4:
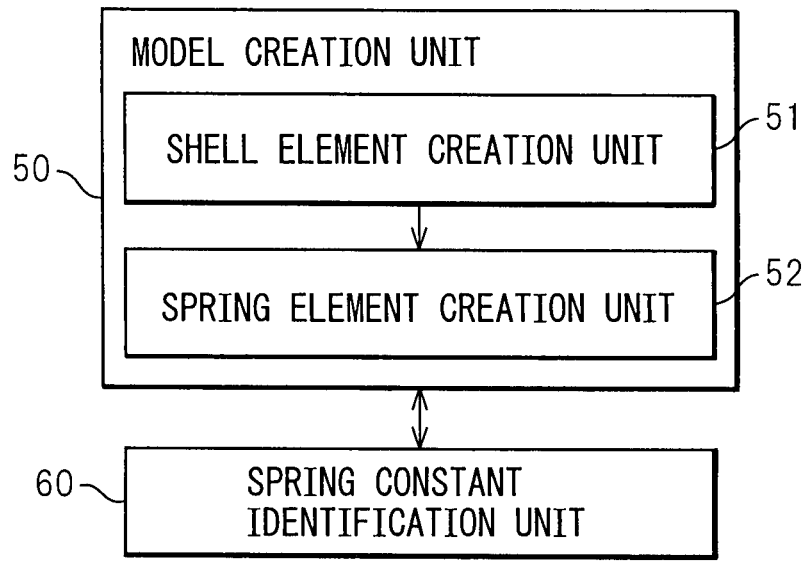
FIG. 4 is a view conceptually showing the hardware configuration for creation of an analysis model.

FIG. 4 conceptually shows the hardware configuration for creating an analysis model of the present invention. This apparatus is comprised of a model creation unit 50 having a shell element creation unit 51 and spring element creation unit 52 and of a spring constant identification unit 60. First, a test model for identification of the spring constant is created by the shell element creation unit 51 and the spring element creation unit 52. Next, in the spring constant identification unit 60, the created test model is used to identify the spring constant of the spring elements. When identifying the spring constant, the analysis model for the entire analyzed object model is created by the shell element creation unit 51 and spring element creation unit 52 and the identified spring constant is introduced as the spring constant for the created analysis model.

The present invention creates a model of a rubber member by spring elements, so compared with use of solid elements for creation of a model, the debugging time of the simulation and the calculation time can be greatly reduced.

Below, referring to FIG. 5 to 16, an embodiment of the present invention will be explained in detail. In the present embodiment, a housing of a mobile phone gripping a rubber member was used as an example, but the invention is not limited to a rubber member. The present invention can be applied to another elastomeric material with a strong nonlinearity including sponges and other superelastomeric materials. Further, the invention is not limited to a mobile phone. The present invention can be applied to any electronic device including members gripping an elastomeric material with a strong nonlinearity.

Figure 5:
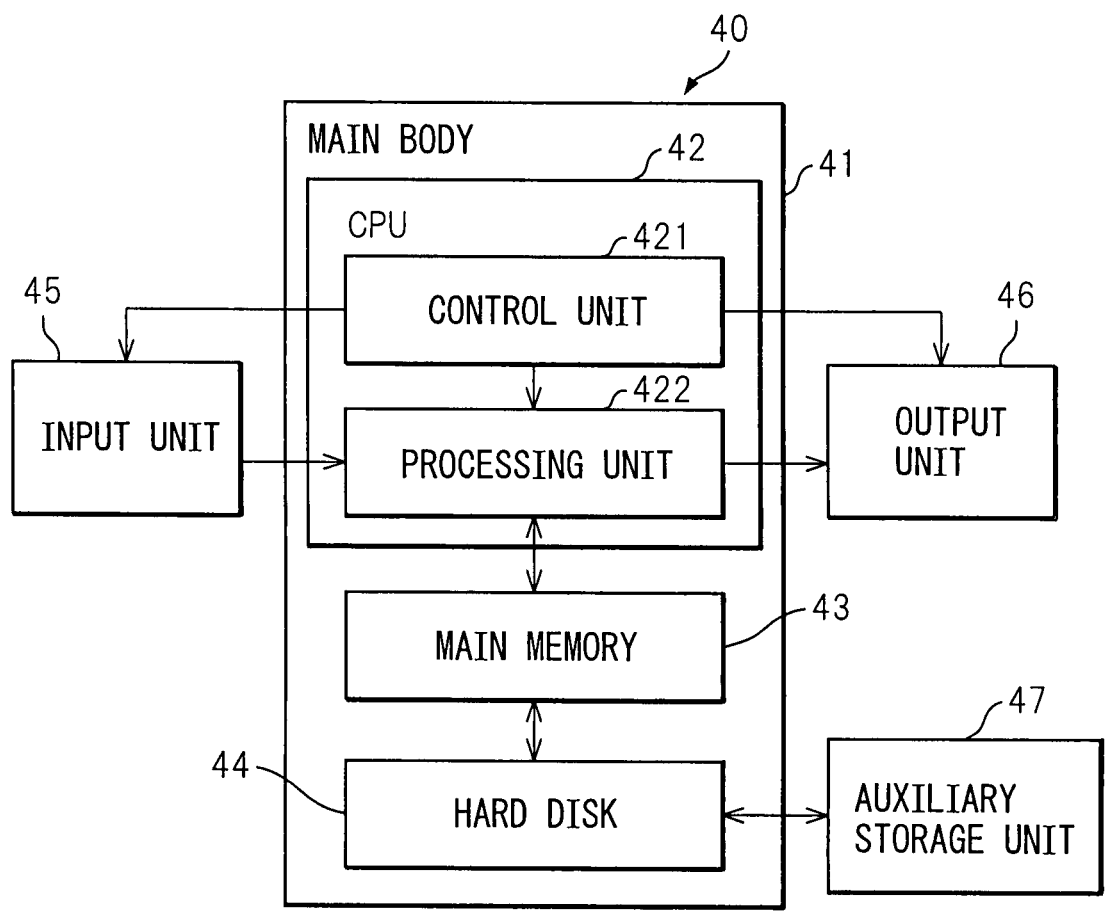
FIG. 5 is a block diagram showing a computer apparatus used for creating an analysis model of the present embodiment.

FIG. 5 is a block diagram showing an outline of a computer apparatus for creating an analysis model of the present embodiment.

The computer apparatus 40 can be realized by a PC, a workstation, etc. The computer apparatus 40 is comprised of a keyboard, mouse, or other input device 45, a box 41, a display or printer or other output device 46, and a DVD (digital versatile disc), CD (compact disc), MO (magneto optical disc), FD (flexible disc), or other auxiliary storage device 47. The box 41 has a CPU (central processor unit) 42 functioning as a control means 421 and processing means 422, a main memory 43, and a hard disk 44. The hard disk 44 stores a computer program for giving the method or functions for creating an analysis model. This computer program is read from the hard disk 44 to the main memory 43 and used to operate the CPU 42 to create the analysis model. After creating the analysis model, the system can run an analysis for the analysis model by a computer program for analysis stored in the hard disk. This apparatus for creating an analysis model operates by a computer program, but electronic circuits or other hardware may also be used to configure the apparatus for creating an analysis model.

Figure 6:
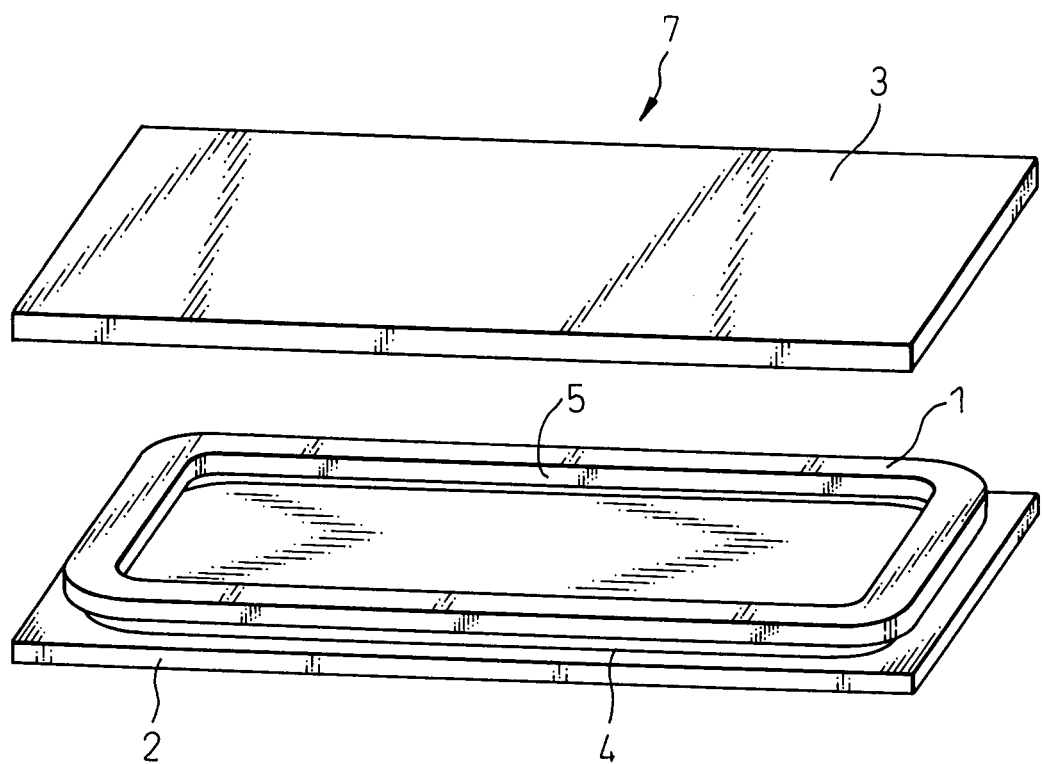
FIG. 6 is a view showing an analyzed object model having a rubber member used in the present embodiment.

FIG. 6 shows an analyzed object model having a rubber member used in the present embodiment. The analyzed object model 7 for example is a model of the housing or covering of a mobile phone or other electronic equipment containing circuit elements etc. as is as a three-dimensional shape. A rubber member 1 is pressed and gripped between a first member 2 and a second member 3. In the present embodiment, an analysis model using spring elements and shell elements is created for the analyzed object model 7.

In FIG. 6, for clarifying the arrangement of the rubber member 1, the second member 3 is described separated from the rubber member 1, but in the actual analyzed object model 7, the second member 3 is arranged in contact with the rubber member 1 and grips the rubber member 1 together with the first member 2. The first and second members 2, 3 are made of plastic, metal, etc. and are more rigid than the rubber member. They should be materials which will only deform by a negligible amount compared with the deformation of the rubber member. Note that the first and second members 2, 3 are arranged at the top and bottom in the figure, but may also be arranged at the left and right. The direction of arrangement of the first and second members is not limited.

As shown in FIG. 6, the first and second members 2, 3 are rectangular plate shaped members. The rubber member 1 is arranged connected with the peripheries of the plate shaped members of the first member 2 and second member 3 to form a substantially rectangular shaped closed region. This closed region forms a model of the space in which the circuit elements etc. are arranged. The width of the rubber member 1 in the direction perpendicular to the longitudinal direction of the contact surface 4 with the first member 2 may be narrower than the contact surface 5 of the rubber member 1 with the second member 3. The area of the contact surface 4 is smaller than the area of the contact surface 5.

Figure 7:
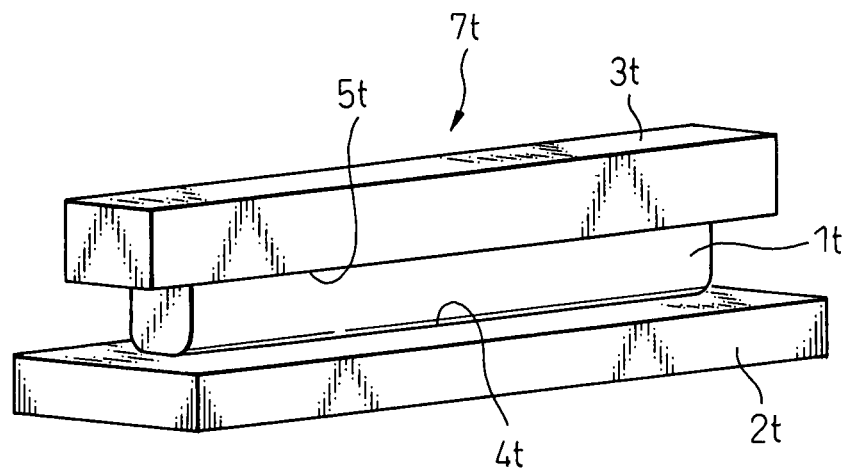
FIG. 7 is a view showing a test model created from an analyzed object model.
Figure 8:
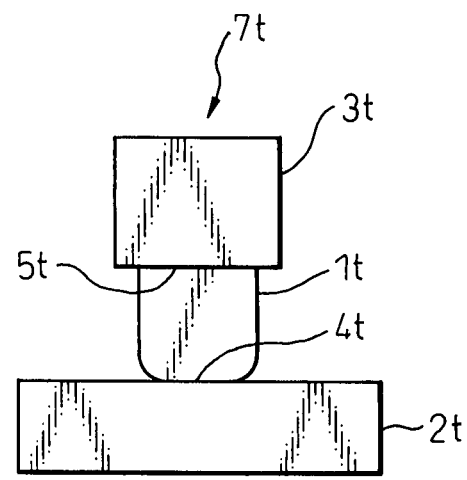
FIG. 8 is a view showing a side surface of a test model.

FIGS. 7, 8 show a test model 7t. FIG. 7 is a perspective view of the test model 7t, while FIG. 8 is a side view of the test model 7t.

The test model 7t is introduced to identify the spring constant of the analysis model. For the test model 7t, a test model using shell elements and a spring element, that is, a spring constant identification model, is created to identify the spring constant. The identified spring constant is used in common for the analysis model using shell elements and spring elements.

The test model 7t is created based on a test piece and fixtures used in a rubber member material test. For the shape of the rubber piece 1t, a simple shape such as a usual rectangle is employed. Next, the first contact surface 4t and second contact surface 5t where this rubber piece 1t contacts the members are designated and a first member piece 2t corresponding to the first member 2 contacted and a second member piece 2t corresponding to the second member are created. In the present embodiment, as shown in FIG. 7, the first contact surface 4t of the rubber member 1t contacting the first member piece 2t is smaller than the second contact surface 5t of the rubber member 1t contacting the second member piece 3t.

In the present embodiment, the rubber member 1 and rubber piece 1t are modeled by arranging spring elements. For the test model 7t and analyzed object model 7, the intervals at which the spring elements are arranged, that is, the spring intervals, have to be made equal. That is, the spring intervals have to be common for the test model 7t and analyzed object model 7 and the springs have to be arranged at equal intervals for the test model 7t and for the analyzed object model 7. The reason is that if not maintaining the intervals between the springs as equal intervals, the spring constant cannot be identified.

When the test model shape 7t is input, to determine the spring intervals, that is, the intervals between nodes of the shell elements in the longitudinal direction, first the total length of the rubber of the analyzed object model 7 is designated. Further, the length of the rubber of the test model 1t is found. Based on the designated total length of the rubber of the analyzed object model 7 and the length of the rubber found from the test model 7t, the spring intervals are determined so as to be common intervals and equal intervals for both the test model 7t and for the analyzed object model 7.

Next, a first shell element is created using the determined spring intervals as the node intervals in the longitudinal direction of the test model 7t for the first contact surface 4t with the smaller area among the first and second contact surfaces 4t, 5t of the rubber piece 1t of the test model. Shell elements are elements dividing a flat surface used for finite element analysis. In the present embodiment, shell elements are created for a contact surface of the rubber member. Spring elements are arranged at several of their nodes.

Figure 9:
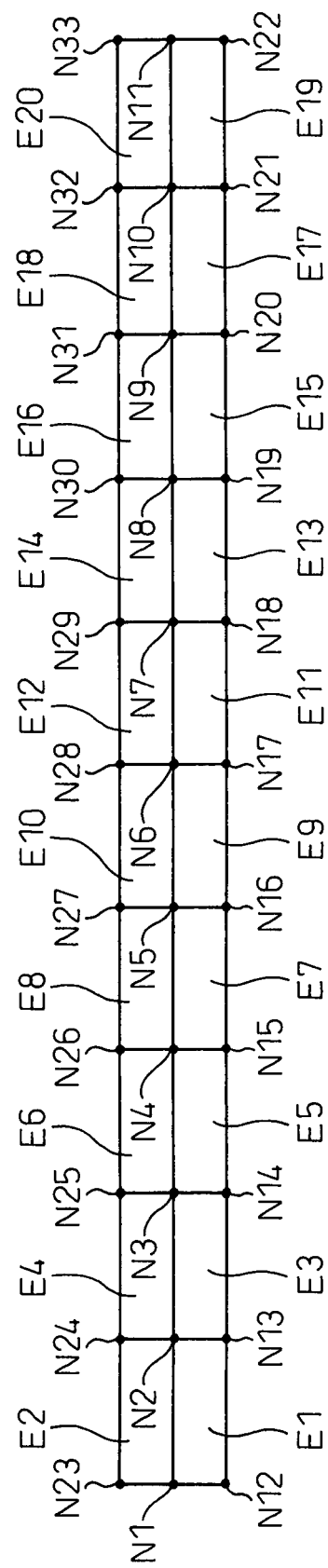
FIG. 9 is a view for explaining first shell elements created at a first contract surface of a rubber member of a test model.

FIG. 9 is a view for explaining first shell elements created for the first contact surface 4t of the rubber piece of the test object model. The shell elements E1 to E20 are rectangular in shape and are formed in two rows along the longitudinal direction of the first contact surface 4t. Node elements N1 to N11 are arranged on a longitudinal direction line dividing the first contact surface 4t or rubber piece 1t into two in the longitudinal direction. The node elements N1 to N11, as explained later, are points at which the spring elements are arranged. The shell elements are given node intervals, so by designating the contact surface, are automatically created by an analysis apparatus or program. The node numbers N1 to N33 and element numbers E1 to E20 are automatically given in a predetermined order. Here, the interval of the nodes N1, N2 is the spring interval, while the intervals of the nodes N1 and N12 and the nodes N1 and N23 are half of the width of the contact surface 4t.

Figure 10:
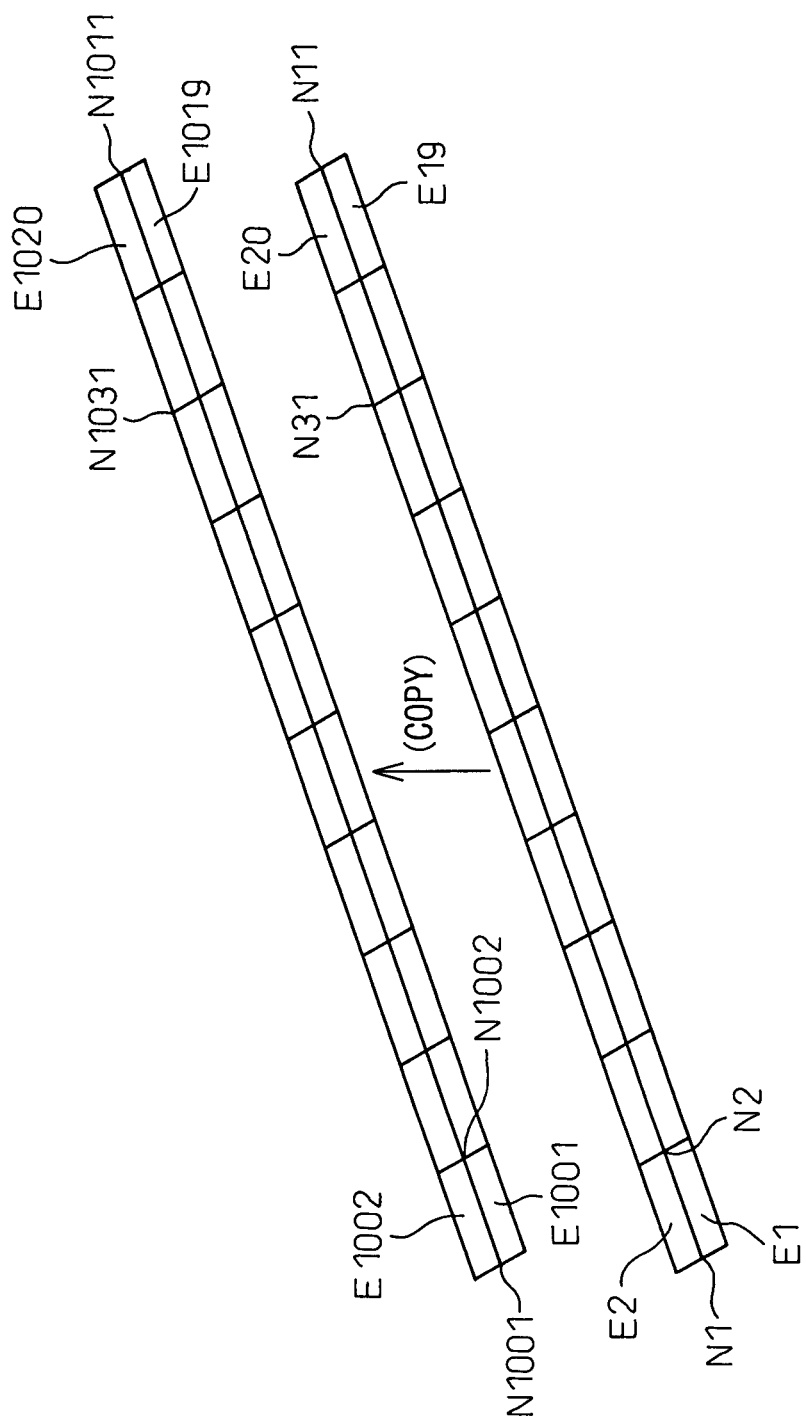
FIG. 10 is a view for explaining a step of creating second shell elements by copying first shell elements onto a second contact surface.

Next, as shown in FIG. 10, the first shell elements formed on the first contact surface 4t are copied to the second contact surface 5t of the rubber piece 1t and second member piece 3t to create second shell elements. Here, the second contact surface 5t is wider in area compared with the first contact surface 4t, so the first shell elements are all copied to the second contact surface 5t without problem. Further, the node numbers and the element numbers are automatically assigned by a predetermined order. For example, in the first shell elements, the nodes of the node numbers N1 to N33 and the elements of the element numbers E1 to E20 are given as the nodes of the node numbers N1001 to N1033 and elements of the element numbers E1001 to E1020 in the second shell elements.

Figure 11:
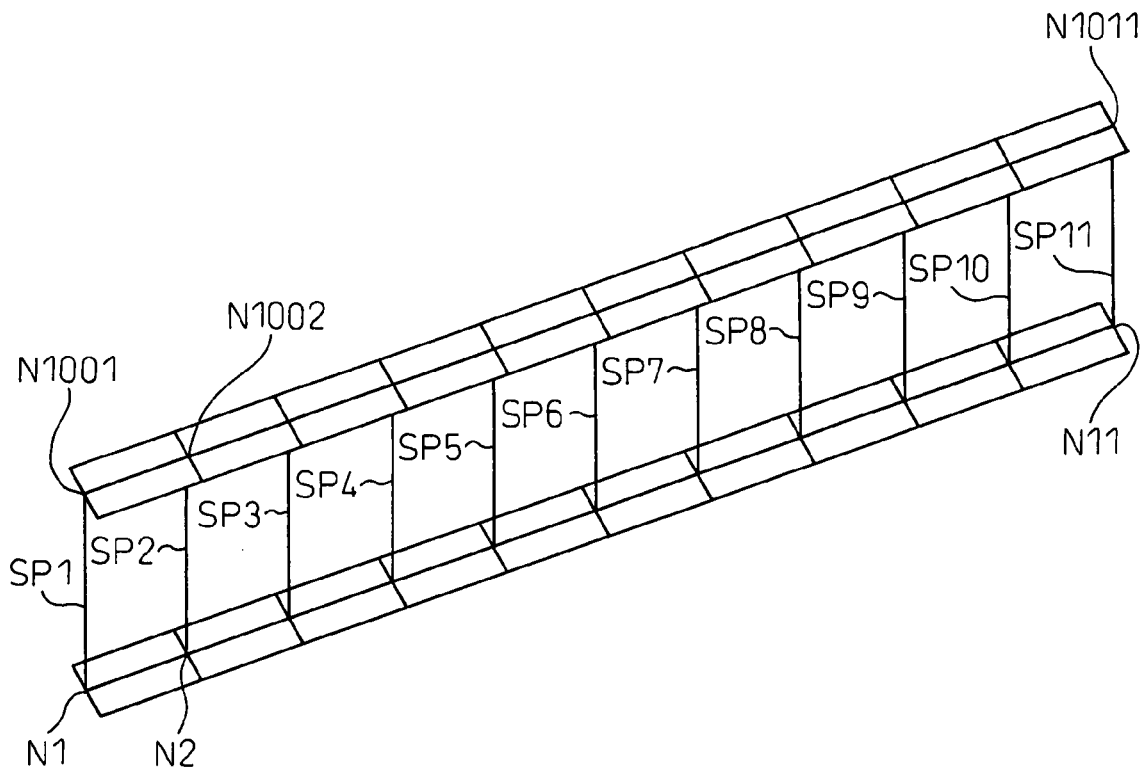
FIG. 11 is a view showing a test model with spring elements set between first and second shell elements.

FIG. 11 shows a test model in which spring elements are set between first and second shell elements. The spring elements SP is modeled by line segments connecting the nodes. First, the node numbers assigned to the first and second shell elements are extracted in a predetermined order. Next, the nodes having the extracted node numbers are connected to create spring elements. Specifically, as shown in FIG. 10, the node numbers N1 to N11 of the first shell elements and the node numbers N1001 to N1011 of the second shell elements are extracted and spring elements SP1 to Sp11 are set between the corresponding nodes. In the present embodiment, nodes arranged at the center of the rubber piece 1t in the longitudinal direction are extracted.

Note that the first and second shell elements formed at the first and second contact surfaces 5t of the rubber piece 1 can be formed independently from the divided meshes created at the first member piece 2t and second member piece 3t. For example, even if the first shell elements do not match with the meshes created at the contact surface of the first member piece 2t, it is possible to designate the surfaces by which the contact surface and first shell elements of the first member piece 2t contact the first member and define them connecting the two surfaces. This point is one of the advantageous points of the present invention where the contact surface of the rubber member is formed by shell elements.

When the test model is completed, the test model is used to identify a nonlinear spring constant of a model of a rubber member comprising a super elastomeric material. First, a suitable value is given as the spring constant of the test model. This initial value is found by calculation from the value obtained from the data of actual material tests and the spring intervals. The analysis is run on a test model having a given spring constant. For example, a load is given to the test model and it is judged if the displacement obtained as a result matches with the data obtained from an actual material test conducted for the material of the rubber member. If not matching, the value of the spring constant of the test model is changed and the analysis repeated until matching in a certain range. Here, this "certain range" means a range of deformation of a rubber member usually required for an actual device or equipment. The spring constant can be changed when the result of the judgment is not a match by automatically adjusting the spring constant so as to proceed in the direction of a match. Further, the spring constant can also be adjusted by automatic adjustment only as a result of processing in accordance with a predetermined formula so as to make the difference with the data obtained from the material test zero.

If the spring constant is identified in this way, an analysis model using spring elements and shell elements is created for the analyzed object model 7 (see FIG. 6) as a whole. The method of creation of the analysis model is substantially the same as the method of creation of the test model.

First, the first contact surface 4 and the second contact surface 5 by which the rubber member 1 of the analyzed object model 7 contacts the first member 2 and second member 3 are designated. Next, shell elements are created for the first contact surface 4 with the smaller area among the designated contact surfaces 4, 5. Here, the intervals between nodes in the longitudinal direction of the first contact surface 4 are made equal to the spring intervals obtained at the time of creation of the test model. The node numbers and element numbers of the shell elements are automatically given in an orderly fashion. Due to this, the created shell elements have the same size, same shape, and same arrangement as the shell elements of the test model.

The first shell elements created at the first contact surface 4 are copied to the second contact surface 5. Node numbers and element numbers are assigned to the copied second shell elements of the second contact surface 5 in an orderly fashion as well.

Next, the node numbers for creation of the spring elements are fetched in an orderly fashion and spring elements are created between the nodes of the first shell elements and second shell elements. In this way, an analysis model comprised of shell elements and spring elements corresponding to the analyzed object model 7 is created. The analysis model is an expansion of the test model shown in FIG. 11 to the analyzed object model 10 as a whole.

The analysis model of the present embodiment is a model comprised of shell elements and spring elements, so can be greatly reduced in debugging time and calculation time compared with conventional modeling by creating a mesh by 3D solid elements. For example, in one example, the debugging time can be reduced 70% and the calculation time by 75%. Specifically, in analysis of a rubber water seal of a housing of a mobile phone, the debugging time was reduced from the conventional 20 hours to six hours and the calculation time from six hours to 1.5 hours.

Figure 12:
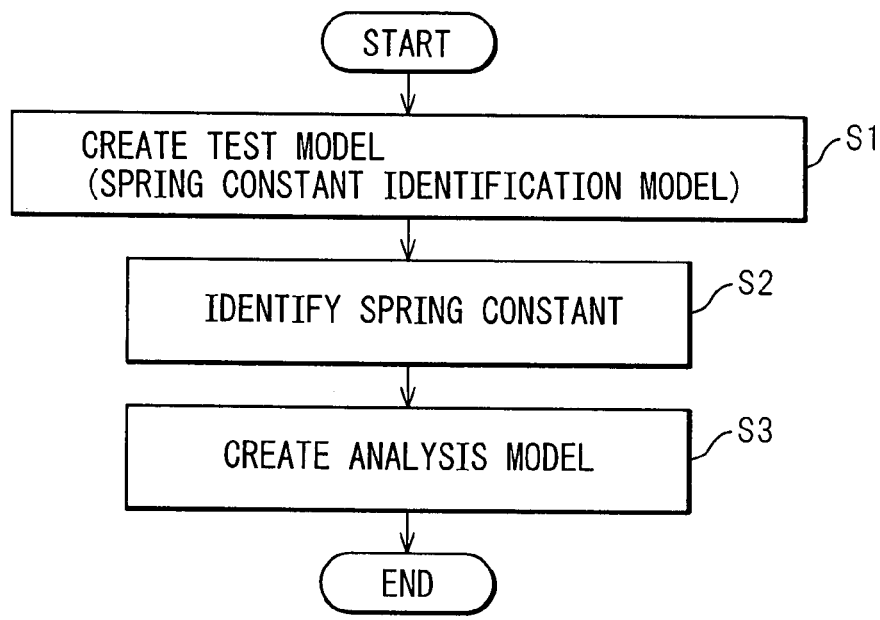
FIG. 12 is a view showing the overall flow for creation of an analysis model in the present embodiment.
Figure 13:
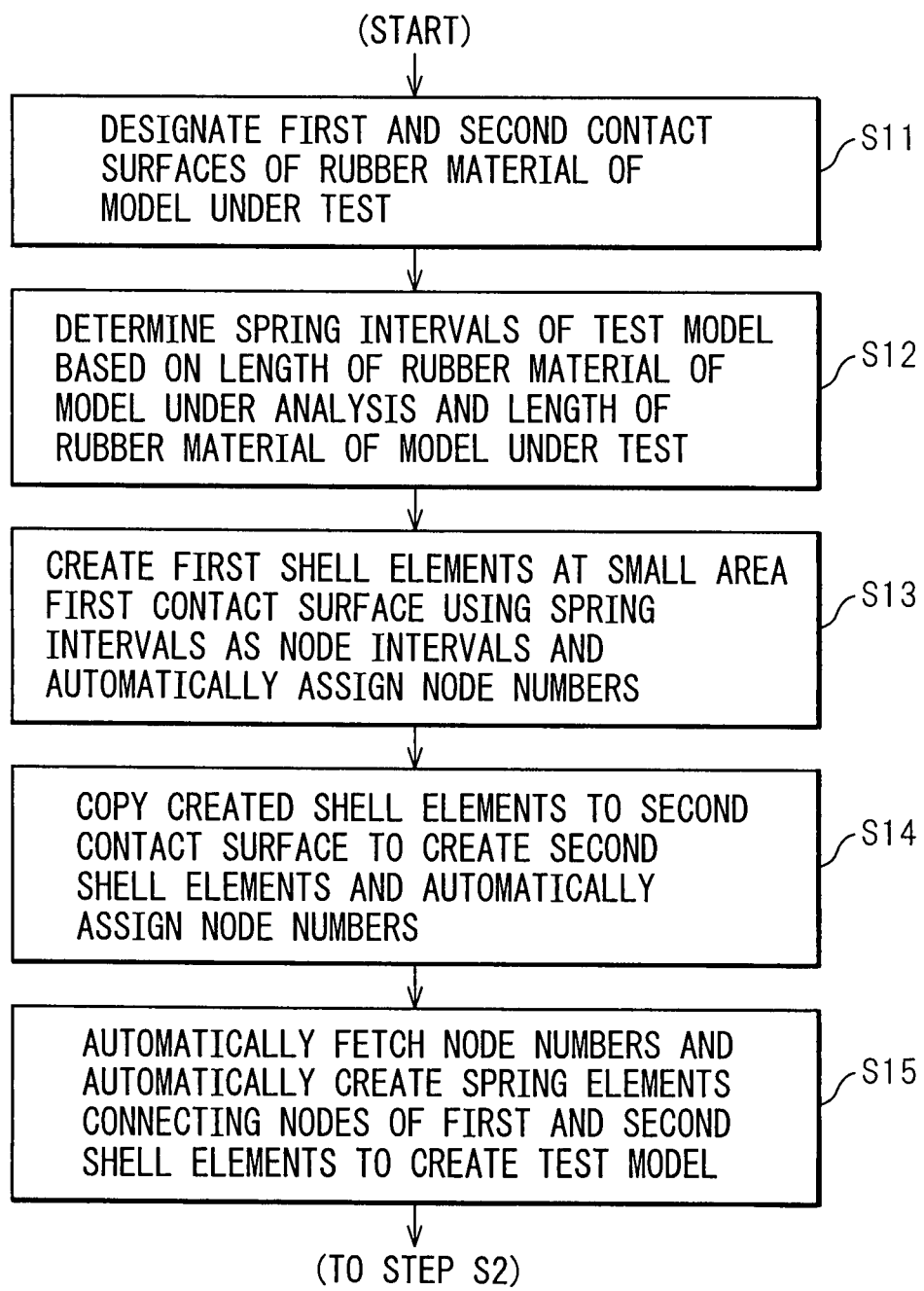
FIG. 13 is a view showing details of a test model creation step in the flow of creation of an analysis model.
Figure 14:
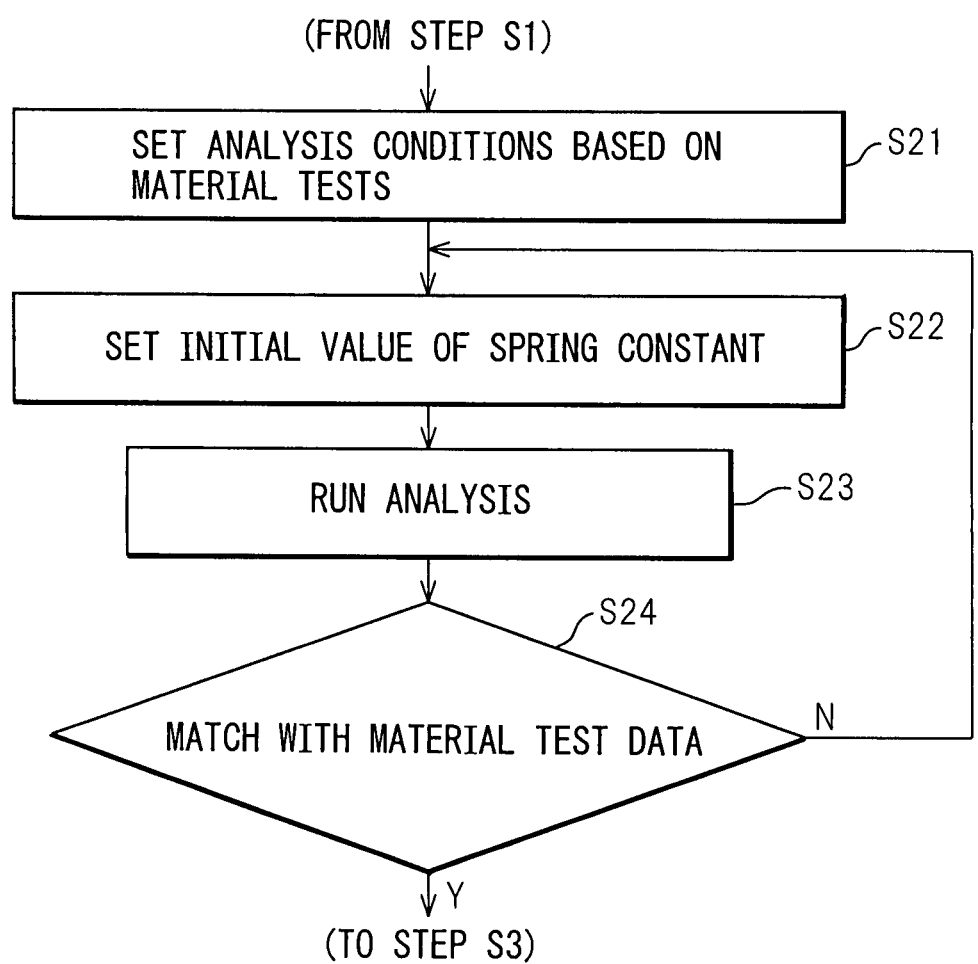
FIG. 14 is a view showing details of a spring constant identification step in the flow of creation of an analysis model.
Figure 15:
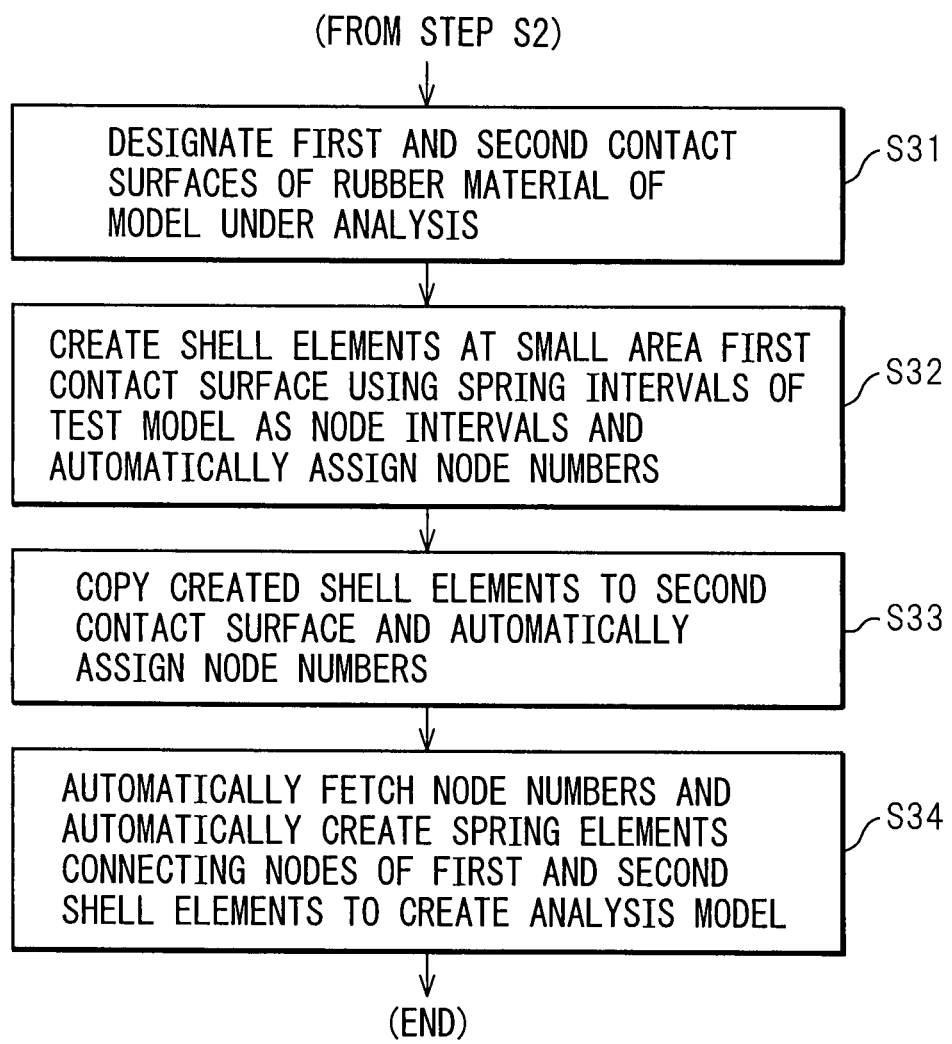
FIG. 15 is a view showing details of an analysis model creation step in the flow of creation of an analysis model.

FIGS. 12 to 15 are views showing the flow for creation of an analysis model of the present embodiment. FIG. 12 shows the overall flow of creation of an analysis model, while FIGS. 13 to 15 show the detailed flow of the steps of the overall flow shown in FIG. 12.

Referring to FIG. 12, at step S1, a test model for identifying the spring constant used for the analysis model, that is, a spring constant identification model (FIG. 11), is created for an analyzed object model having a rubber member (FIG. 6).

When the test model is created, at step S2, the spring constant is identified considering the actual data of a material test.

When the spring constant is identified, at step 3, the same steps as with creation of the test model are used to create an analysis model having spring elements, shell elements, and the identified spring constant.

FIG. 13 shows details of the test model creation step S1.

At step S11, the first contact surface 4t and second contact surface 5t of the rubber member 1t are designated for the test model 7t expressing the material test (FIG. 7).

When the first and second contact surfaces 4t, 5t are determined, at step S12, the spring intervals are determined based on the length of rubber member 1 of the analyzed object model 7 and the length of the rubber member 1t of the test model 7*t*. The spring intervals are common to and become equal intervals at both the analyzed object model 7 and the test model 7*t*.

At step S13, at the first contact surface 4*t* with the narrower contact surface area, first shell elements are created using the spring intervals found at step S12 as the node intervals, and node numbers and element numbers are automatically assigned in an orderly fashion (FIG. 9).

At step S14, the first shell elements created at the contact surface 4*t* are copied to the contact surface 5*t* to create second shell elements at the contact surface 5*t* and automatically assign node numbers and element numbers in an orderly fashion.

At step S15, the node numbers of the first and second shell elements for arrangement of the spring elements are automatically fetched and the corresponding nodes are connected so as to automatically create spring elements. The meshes of the first member and second member are created and the creation of the mesh of the test model (FIG. 11) is completed.

FIG. 14 shows details of the flow of the spring constant identification step S2.

To identify the spring constant using a test model, at step S21, the boundary conditions and other analysis conditions are set based on data obtained by running material tests on an actual rubber material.

At step S22, the initial value of a nonlinear spring constant is set. As the set initial value, a spring constant calculated from the data of actual material tests may be used.

At step S23, a numerical simulation using the finite element method is run to analyze the test model.

At step S24, it is judged if the results of analysis of step S23 match the material test data in a predetermined range. If not matching, the routine returns to step S22 where the spring constant is reset so as to match with the test data, then the analysis of step S23 is run again. Note that the spring constant may also be adjusted by a predetermined amount so as to match with the test data. Alternatively, it is also possible to adjust the calculated amount calculated by a predetermined calculation formula so as to match with the test data. Whatever the case, the model creation apparatus may be used for automatic resetting.

At step S24, if judging that the constant matches with the material test data in a predetermined range, the spring constant at that time is identified as the spring constant sought and the routine proceeds to step S3.

FIG. 15 shows details of the flow of the analysis model creation step S3.

The analysis model creation step S3 is substantially the same as the test model creation step S1. As will be understood if comparing the flow of creation of an analysis model of FIG. 15 and the flow of creation of a test model of FIG. 13, the flow of FIG. 15 just does not have any step corresponding to step S12 for finding the spring intervals of the flow of creation of the test model. The other steps are the same. At the time of creation of an analysis model, the spring intervals used when creating the test model is used, so a step for newly finding the spring intervals is not required.

The analysis model creation step first, at step S31, designates the first and second contact surfaces 4, 5 of the rubber member 1 of the analyzed object model (FIG. 6).

At step S32, first shell elements having the spring intervals of the test model as the node intervals are created and the node numbers and element numbers are automatically assigned in an orderly fashion for the contact surface with the smaller area, that is, the first contact surface 4.

At step S33, the created first shell elements are copied to the second contact surface 5 to create second shell elements and node numbers and element numbers are automatically assigned in an orderly fashion.

At step S34, the first and second node numbers for creating the spring elements are automatically fetched and the nodes corresponding to the fetched node numbers among the nodes of the first and second shell elements are connected to automatically create spring elements. The analysis model is an expansion of the test model (FIG. 11) to the analyzed object model as a whole.

Figure 16:
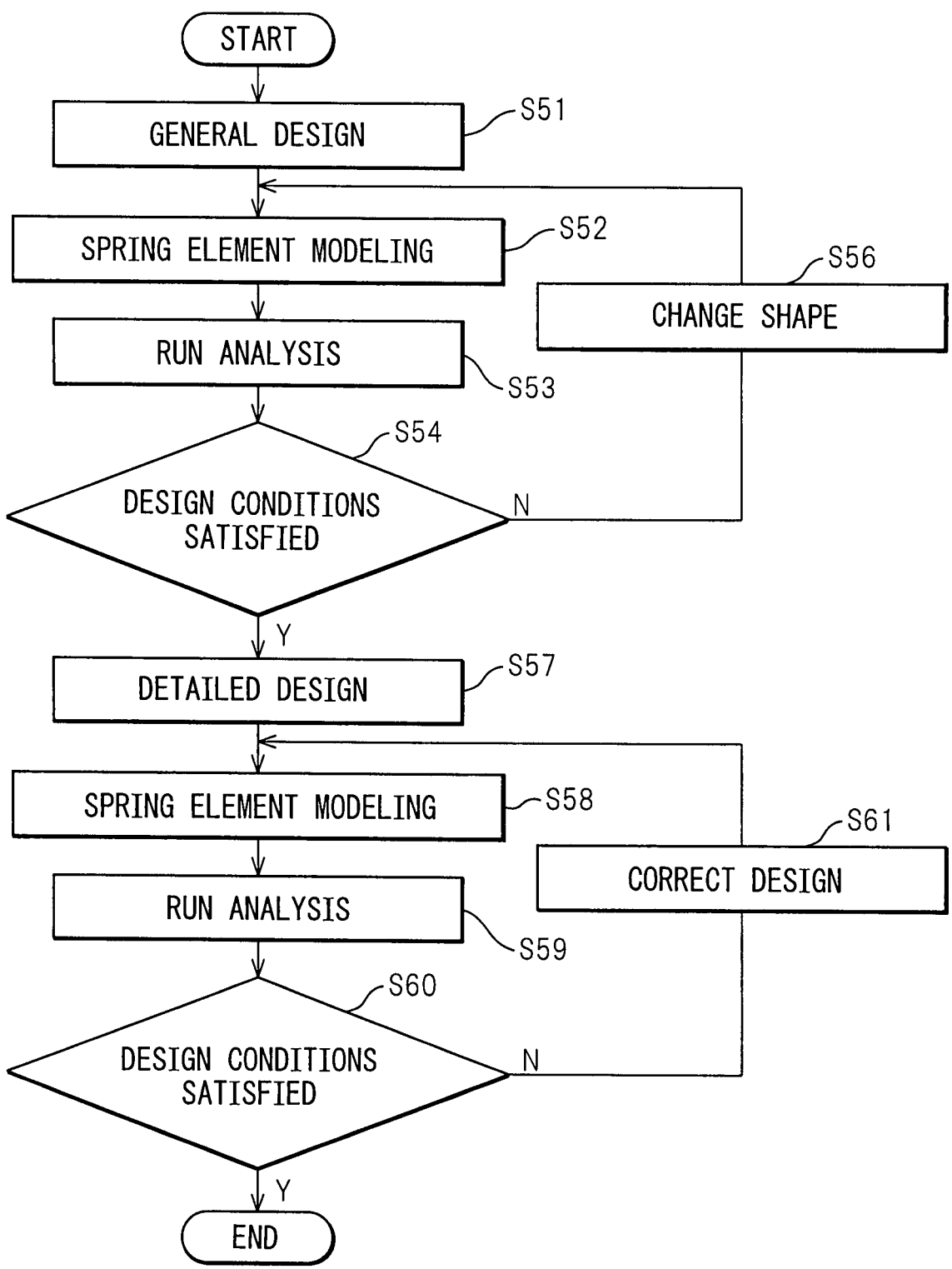
FIG. 16 is a view showing the flow of design of electronic equipment using an analysis model of the present embodiment.

FIG. 16 shows an outline of the process for using the above-mentioned analysis model to design and produce a mobile phone or other electronic equipment, in particular its housing.

If a mobile phone is planned, at the first step S51, the mobile phone housing is roughly designed. In this example, the housing is formed by assembling the first member and the second member through a rubber member. The inside forms a space where the electronic components are arranged.

At step S52, a model of a rubber member is created by spring elements and shell elements (hereinafter, referred to as "spring element modeling"). That is, first, based on the roughly design analyzed object model, the spring elements and the shell elements are used to create a test model and identify the spring constant. Next, for the analyzed object model, the spring elements and the shell elements are used to create an analysis model and reflect the obtained spring constant in it.

At step S53, the analysis model is used for analysis by numerical simulation. At step S54, it is judged if the results of analysis satisfy the conditions of the rough design. If the results of analysis do not satisfy the conditions of the rough design, at step S56, the first member, second member, or rubber member is changed in shape, step S52 is returned to, then the spring element modeling is performed again and the analysis of step S53 is run.

At step S54, if it is judged that the results of analysis match the conditions of the rough design, the routine proceeds to the detailed design of step S57. When the fine design at step S57 ends, at step S58, spring element modeling is performed for the finely designed object.

Next, at step S59, the analysis model is used for analysis by numerical simulation, then at step S60, it is judged if the results of analysis satisfy the conditions of the fine design. If the results of analysis do not satisfy the conditions of the fine design, at step S61, the first member, second member, or rubber member is changed in shape, step S58 is returned to, then spring element modeling is performed again and the analysis of step S59 is run.

At step S60, if it is judged that the results of analysis satisfy the conditions of the rough design, the design process ends. After the design process ends, the production process is started. In the present embodiment, in the rough design and the fine design, the simulation analysis is performed using the analysis model obtained by the spring element modeling, so the debugging time and the calculation time are both greatly reduced.

While the invention has been described with reference to specific embodiments chosen for purpose of illustration, it should be apparent that numerous modifications could be made thereto by those skilled in the art without departing from the basic concept and scope of the invention.

The invention claimed is:

1. An apparatus for creating an analysis model of an elastomeric material member, comprising:
   a shell element creation unit that creates shell elements on the elastomeric material member having a strong nonlinearity and sandwiched between a first member and a second member, the shell element creation unit creating first shell elements defined by first nodes on a first contact surface of the elastomeric material member contacting the first member and then creating second shell elements by defining second nodes having the same interval as an interval between the first nodes on a second contact surface of the elastomeric material member contacting the second member, the first and second shell elements created independently from meshes created in the first and second members on surfaces of the first and second members that respectively faces the first and second contact surfaces of the elastomeric material member;

a spring element creation unit creating a spring element between each of the first nodes and a second node corresponding to the each of the first nodes; and a spring constant identification unit for identifying a spring constant of the spring elements, the spring element creation unit creates spring elements between nodes of the created first and second shell elements to create a test model, the spring constant identification unit identifies the spring constant of the test model using an initial value found from material test data of the elastomeric material member and the node interval.

2. The apparatus as set forth in claim 1, wherein said shell element creation unit creates the first shell elements at said first contact surface using spring intervals as node intervals and creates the second shell elements by copying said first shell elements on said second contact surface.

3. The apparatus as set forth in claim 1, wherein said spring element creation unit extracts node numbers of said created first and second shell elements in an orderly fashion and creates spring elements between the extracted nodes.

4. The apparatus as set forth in claim 1, wherein said shell element creation unit finds node intervals to create first and second shell elements so that intervals become equal intervals common for the total length of the elastomeric material member and a length of a test piece of said elastomeric material member for part of said elastomeric material member.

5. The apparatus as set forth in claim 4, wherein said shell element creation unit creates first and second shell elements at the same node intervals as the node intervals of the test model for said elastomeric material member as a whole, and said spring element creation unit creates spring elements between the nodes of the created first and second shell elements and uses the spring constant of said identified test model as the spring constant.

6. A non-transitory storage medium having stored thereon a computer program to create an analysis model of an elastomeric material member, which program makes a computer perform:

a shell element creation function that creates shell elements on the elastomeric material member having a strong nonlinearity and sandwiched between a first member and a second member, the shell element creation function creating first shell elements defined by first nodes on a first contact surface of the elastomeric material member contacting the first member and then creating second shell elements by defining second nodes having the same interval as an interval between the first nodes on a second contact surface of the elastomeric material member contacting the second member, the first and second shell elements created independently from meshes created on surfaces of the first and second members that respectively faces the first and second contact surfaces of the elastomeric material member;

a spring element creation function creating a spring element between each of the first and a second node corresponding to the each of the first nodes; and a spring constant identification function for identifying a spring constant of said spring elements, the spring element creation function creates spring elements between nodes of the created first and second shell elements to create a test model, the spring constant identification function identifies the spring constant of the test model using an initial value found from material test data of the elastomeric material member and the node interval.

7. The storage medium as set forth in claim 6, wherein said shell element creation function creates the first shell elements at said first contact surface using spring intervals as the node intervals and creates the second shell elements by copying said first shell elements on said second contact surface.

8. The storage medium as set forth in claim 6, wherein said spring element creation function extracts node numbers of said created first and second shell elements in an orderly fashion and creates spring elements between the extracted nodes.

9. The storage medium as set forth in claim 6, wherein said shell element creation unit finds node intervals to create first and second shell elements so that intervals become equal intervals common for the total length of the elastomeric material member and a length of a test piece of said elastomeric material member for part of said elastomeric material member.

10. A method of creating an analysis model of an elastomeric material member, the method comprising:

creating shell elements on the elastomeric material member having a strong nonlinearity and sandwiched between a first member and a second member, the creating shell elements including creating first shell elements defined by first nodes at a first contract surface of said elastomeric material member contacting the first member, and creating second shell elements by defining second nodes having the same interval as an interval between the first nodes on a second contact surface of the elastomeric material member contacting the second member, the first and second shell elements created independently from meshes on surfaces of the first and second members that respectively faces the first and second contact surfaces of the elastomeric material member;

creating a test model by arranging a spring element between each of the first nodes and a second node corresponding to the each of the first nodes;

and using an initial value found from material test data of the elastomeric material member and the node interval to identify the spring constant of said spring elements.

11. The method as set forth in claim 10, further comprising, creating first shell elements defined by first nodes at the first contact surface of said elastomeric material member contacting said first member, creating second shell elements defined by second nodes projected at points corresponding to the first nodes on the second contact surface of said elastomeric material member contacting said second member, creating an analysis model by arranging spring elements between the first and second nodes, and using the identified spring constant as the spring constant of said analysis model.

12. The method as set forth in claim 10, wherein said step of creating second shell elements creates the second shell elements by copying said first shell elements on said second contact surface.

13. The method as set forth in claim 10, wherein said step of creating spring elements extracts node numbers of said created first and second shell elements in an orderly fashion and creates spring elements between the extracted nodes.

14. The method of designing electronic equipment having an elastomeric material member, the method comprising:

creating an analysis model for analyzing the elastomeric material member having a strong nonlinearity and sandwiched between a first member and a second member, the analysis model having an identified spring constant comprising first shell elements defined by first nodes on a first contact surface of said elastomeric material member contacting said first member, second shell elements defined by second nodes having the same interval as an interval between the first nodes on a second contact surface of the elastomeric material member contacting the second member, the first and second shell elements created independently from meshes created on surfaces of the first and second members that respectively faces the first and second contact surfaces of the elastomeric material member, and a spring element created between each of the first nodes and a second node corresponding to the each of the first nodes, the identified spring constant identified using an initial value found from material test data of the elastomeric material member and the node interval; and using the analysis model to judge if the design conditions have been satisfied and, when the design conditions have not been satisfied, changing the design of at least one of the first member, the second member, or the elastomeric material member.

* * * * *